United States Patent [19]
Hinkle et al.

[11] Patent Number: 5,651,130
[45] Date of Patent: Jul. 22, 1997

[54] MEMORY CONTROLLER THAT DYNAMICALLY PREDICTS PAGE MISSES

[75] Inventors: Lee B. Hinkle; Gary W. Thome, both of Tomball; Paul A. Santeler, Cypress; David R. Wooten, Spring; John A. Landry, Tomball, all of Tex.

[73] Assignee: Compaq Computer Corporation, Houston, Tex.

[21] Appl. No.: 544,109

[22] Filed: Oct. 17, 1995

Related U.S. Application Data

[63] Continuation of Ser. No. 34,104, Mar. 22, 1993, abandoned.

[51] Int. Cl.⁶ .................................................. G06F 13/16
[52] U.S. Cl. ........................ 395/432; 395/438; 395/494; 395/550
[58] Field of Search ............................... 395/432, 438, 395/494

[56] References Cited

U.S. PATENT DOCUMENTS

| | | | |
|---|---|---|---|
| 5,113,511 | 5/1992 | Nelson et al. | 395/425 |
| 5,148,538 | 9/1992 | Celtruda et al. | 395/425 |
| 5,239,639 | 8/1993 | Fischer et al. | 395/425 |
| 5,269,010 | 12/1993 | MacDonald | 395/425 |
| 5,291,580 | 3/1994 | Bowden, III et al. | 395/425 |
| 5,303,364 | 4/1994 | Mayer et al. | 395/400 |
| 5,333,293 | 7/1994 | Bonella | 395/425 |
| 5,341,494 | 8/1994 | Thayer et al. | 395/425 |
| 5,359,722 | 10/1994 | Chan et al. | 395/425 |

OTHER PUBLICATIONS

Intel Corporation Cache and DRAM Controller (CDC) S82424TX, Revision 1., pp. 44–45.
Peripheral Components 1993 (Intel), pp. 1–522; 1–567 to 1–570 (Oct. 1992).
Peripheral Component Interconnect (Intel), 82420 PCIset Cache/Memory Subsystem (May 1993), pp. 23, 69–70.

*Primary Examiner*—Reba I. Elmore
*Attorney, Agent, or Firm*—Pravel, Hewitt, Kimball & Krieger

[57] ABSTRACT

A memory controller dynamically predicts whether a next memory cycle which is not yet available will result in a page miss or page hit condition. RAS lines are selectively precharged if the next memory cycle is predicted to be a page miss. The memory controller keeps track of various combinations of types of cycles when a type of memory cycle is followed by a type of non-memory pending cycle. For each such combination, the memory controller determines the percentage of combinations which result in a page hit on the next memory cycle. Using this history, the memory controller selectively precharges the RAS lines when a certain combination of types of cycles indicates a percentage of hits is below a predicted threshold. If a number of page hits exceeds the predicted threshold, precharging is not performed.

18 Claims, 12 Drawing Sheets

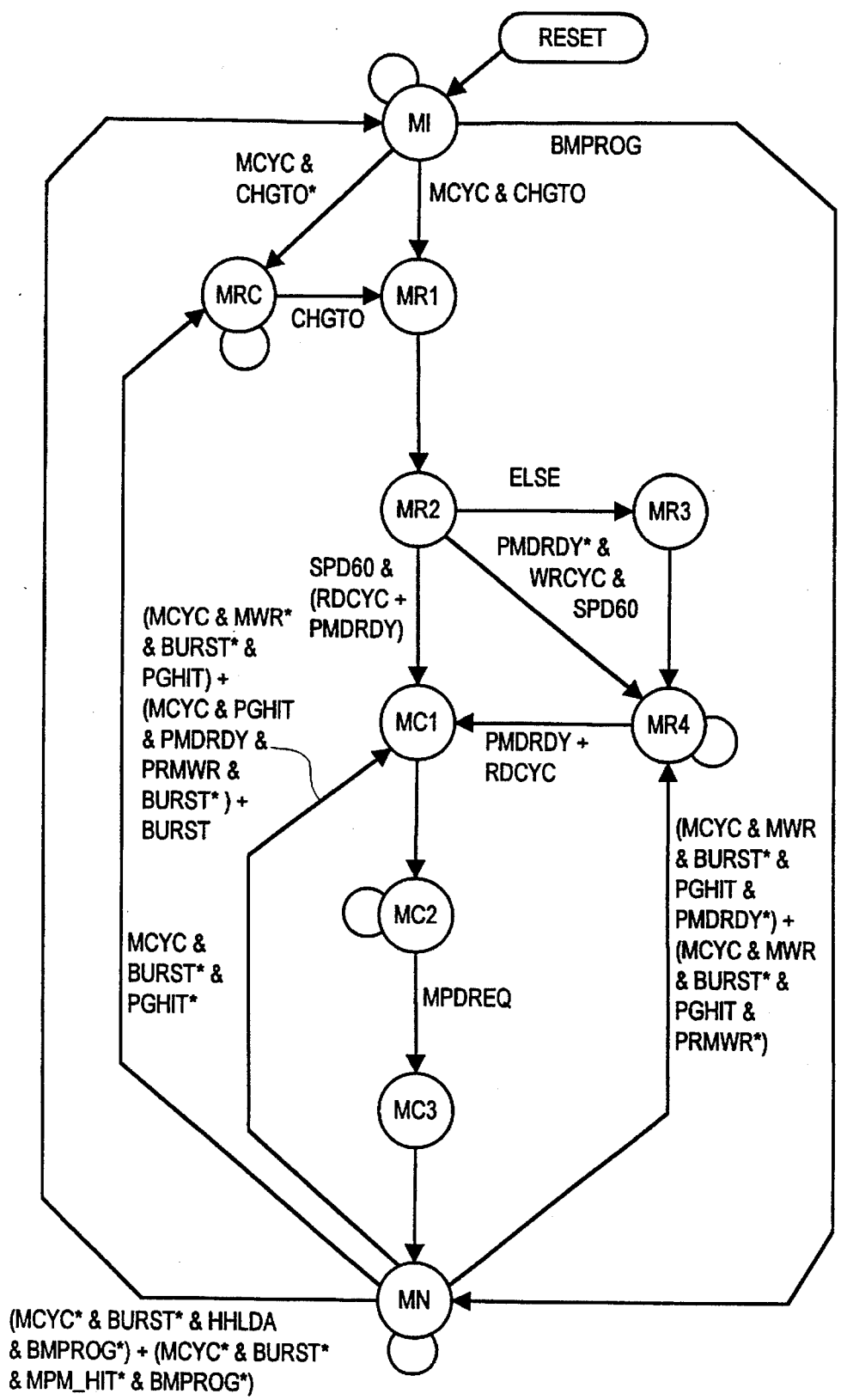
FIG. 8 MEM STATE MACHINE

BURST STATE MACHINE

MEMORY CONTROLLER THAT DYNAMICALLY PREDICTS PAGE MISSES

This is a continuation of application Ser. No. 08/034,104, filed on Mar. 22, 1993 now abandon.

BACKGROUND OF THE INVENTION

1. Field of the Invention

The invention relates to memory controllers used with computers, and more particularly to memory controllers that dynamically predict the relative chance of a page miss after certain cycles and precharge DRAMs in response to that prediction.

2. Description of the Related Art

Microprocessor-based computer systems have been increasing in performance at a tremendous rate. Much of this increase has been based on the improvements in the microprocessor itself. For example, clock speeds are reaching those previously used only by mainframe computers. However, affordable memory device performance has not been increasing at the same rate. Indeed, dynamic random access memory (DRAM) performance has flattened out recently, with the majority of the effort being concentrated on increasing device storage size. Thus main memory has become a bottleneck.

Cache memory systems, where a small amount of very fast, expensive static random access memory (RAM) is used to store copies of the data, have made the problem somewhat less severe, but the designs are very complicated and expensive. Further, the poor memory performance returns when access must be made to main memory. So there still is a need to improve the performance of the main memory system.

Page mode memory devices provide one way to increase memory system performance. If consecutive accesses are made to the same row address, referred to as the same page, only column addresses need be provided. This allows a dramatic reduction in cycle time for those cases, referred to as page hits. This is a quick gain and relatively easily made by itself, but more performance is always desired.

If a consecutive access is not made to the same row address (a page miss), then both the row address and the column address must be provided to the memory device. This is done consecutively, and obviously takes longer than simply providing a column address. The performance penalty of a page miss, however, is even more severe, as before the row address strobe, or RAS*, signal can be provided, that signal must be taken high for a relatively long fixed amount of time known as the precharge time (the physical line, RAS* is driven high during the precharge period). For example, an 80 nanosecond DRAM will typically require 60 nanoseconds of precharge before the RAS signal can be driven low. Further, once this precharge is begun, it cannot be aborted. Throughout this disclosure, an asterisk (*) at the end of the signal name indicates the physical signal is active low; the logical state of the corresponding logical signal without an asterisk is active high. Therefore, RAS* is the active low physical signal that corresponds to the active high logical signal RAS. Additionally, a signal with the asterisk indicates the inverse of the signal without the asterisk.

Thus, RAS precharge time can significantly degrade the performance of a system on a memory page miss. It would be desirable to lessen the performance penalty associated with RAS precharge time on page misses.

Prior memory controllers address this problem to some extent by keeping the RAS, signal low after a cycle is completed, effectively betting that a page hit will occur next, thus gaining performance by not having to do a full cycle. But if the bet is wrong, even further delay is induced as the miss determination takes some time and that time must then be added to the precharge time to determine effective access time. Generally holding RAS, low provides an improvement, but because of the increased penalty for miss cases, there still is room for improvement, and improvement is always desirable.

SUMMARY OF THE INVENTION

A memory controller constructed according to the invention dynamically monitors the relative chance of a page hit versus a page miss after each memory cycle. If the next memory address is not yet available at the end of that cycle, if the next cycle is a cache hit, or if the next cycle is an external bus cycle, the memory controller predicts the relative chance of a page hit versus a page miss based upon the previous memory cycle and the pending non-memory cycle, and begins a RAS precharge if the chance of a page hit is below a certain threshold. When the next memory address does become available, the memory will then already be precharged, so the RAS and CAS cycles can be performed without a precharge.

A memory performance monitor according to the invention dynamically monitors the occurrence of each of four basic memory cycles, as the chance of a page hit after each of these cycles will typically be different. These cycles are a memory data write (DW), memory data read (DR), memory code read (CR), or a cache write back cycle (WB). After each of these cycles there is a certain probability that the next memory operation will be a page hit. This probability will be different for every application and will even vary over time within applications. If the probability is high that the next cycle will be a page hit, system performance is increased by leaving RAS* low in anticipation of a page hit. If the probability is high that the next cycle will be a page miss, system performance is increased by negating RAS* and performing the RAS precharge while waiting for the next cycle.

After each of these four basic cycles, the relative chance of a page hit versus a page miss is monitored based on three distinct occurrences: the processor coming out of pipeline and thus going to an idle state, a host bus cycle, or a processor read hit to a level 2 cache. This creates a four by three matrix for a total 12 distinct combinations which must be monitored. When the probability of page hit following cycle X based on processor activity Y is over a predetermined threshold, the memory performance monitor predicts a page hit and does not force a RAS precharge (although other occurrences, such as an erroneous prediction and a subsequent page miss, could force a RAS precharge). However, when the probability of page hit following cycle X based on processor activity Y is below the predetermined threshold, the memory performance monitor predicts a page miss and forces a RAS precharge.

When the memory performance monitor predicts a page miss and begins a precharge, it cannot abort that precharge. So, in setting thresholds for predicting a miss and a hit, values must be chosen knowing that if the prediction of a miss is wrong, the memory performance monitor will then be forcing a precharge and a RAS cycle when none was needed. This, however, is not as great of a penalty as it might seem, as both the precharge and the strobing of the RAS will often occur before the data for next cycle becomes available if the address is pipelined with respect to the data. The front end of the memory performance monitor is responsible for monitoring the system activity. When any of the four possible memory cycles occurs, the controller remembers which one. The controller then monitors the processor to determine if the processor comes out of pipelining, executes a host bus cycle, or runs a read cache hit to the level 2 (L2) cache. If more than one of these cases occurs, the controller only remembers the last occurrence. When a new cycle is run to the memory system, the controller determines if the result was a page hit or page miss. The front end now possesses two pertinent facts which are passed on to the counter section: (1) which one of the 12 possible combinations of cycles occurred (for example, writeback/cache hit or code read/out of pipeline) and (2) whether the next memory cycle was a page hit or page miss.

A counter section that counts combination occurrences and associated hits is composed of ten identical circuits, one for each of the ten possible matrix combinations (in two of the cases, no counter is needed as a precharge is "free" and thus always performed). Each circuit includes an eight-bit occurrence counter and an eight-bit page hit counter. Based on the cycle combination recorded by the front end, the occurrence counter in one of the twelve circuits will be incremented. If the front end indicates the resulting memory cycle was a page hit, the appropriate page hit counter will also be incremented. Each of the ten circuits continues to record occurrences and page hits until the occurrence counter reaches the maximum value. Then, the output of the page hit counter is compared to a preset threshold value. If under the threshold, the probability is higher that a page miss will occur and the circuit clears a memory performance monitor hit register associated with that particular one of the 12 combinations. If over the threshold, the probability is higher that a page hit will occur and the circuit sets that hit register. The counters are then cleared to begin another monitor cycle.

The back end logic tracks exits in the memory performance controller. When a memory cycle is run, the back end records whether the cycle was a memory data write, memory data read, memory code read, or a writeback. Then the back end monitors the occurrence of either the processor coming out of pipelining, executing a host bus cycle, or hitting the L2 cache with a read operation. When one of the processor occurrence triggers happens, the back end samples the hit register of the circuit that corresponds to that combination of cycles (one of twelve). If the hit is negated, the back end sets the memory performance monitor master hit signal low, indicating to the memory cycle state machine of the memory controller to do a precharge in anticipation of a page miss. The back end continues to monitor the processor, possibly detecting other combinations and sampling other conditions where the memory performance controller hit signal may change. Note, once the memory performance controller indicates to the memory cycle state machine that it is predicting a page miss, and once the memory cycle state machine beings a precharge, that precharge must be completed, and the memory performance controller hit signal subsequently going high will not affect that cycle.

BRIEF DESCRIPTION OF THE DRAWINGS

A better understanding of the present invention can be obtained when the following detailed description of the preferred embodiment is considered in conjunction with the following drawings, in which:

FIG. 8–9 and 12–13 are illustrations of state machines demonstrating various aspects of a memory controller according to the invention;

DETAILED DESCRIPTION OF THE PREFERRED EMBODIMENT

Figure 1:
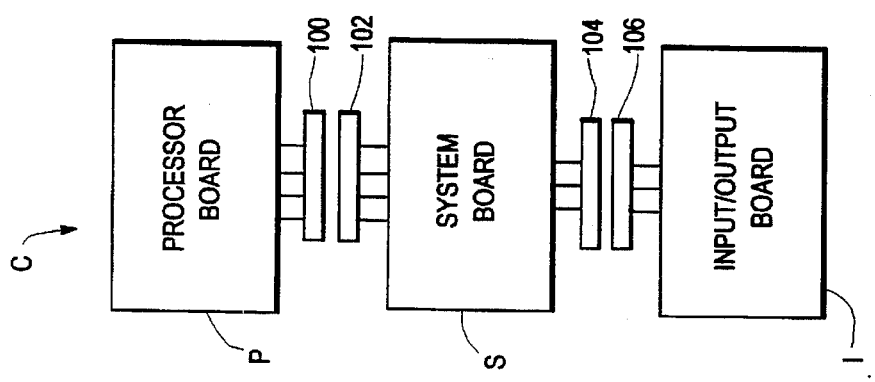
FIG. 1 is a block diagram of a computer system incorporating the present invention.

Referring now to FIG. 1, a computer system C according to the preferred embodiment is shown. A processor board P contains the processor, cache memory and main memory and associated equipment and a connector 100, preferably a card edge. A system board S includes a connector 102 to receive the connector 100, preferably a socket to receive a card edge. The system board S contains common system elements and slots or connectors for interchangeable circuit boards. The system board S also contains an additional connector 104. The connector 104 mates with a connector 106 on an input/output (I/O) board I. Preferably the I/O board I contains certain I/O related features of the computer C, such as the floppy and hard disk drive control units, an audio system and the parallel and serial ports. Additionally, the real time clock and complimentary metal oxide semiconductor (CMOS) memory is on the I/O board I. Each of the processor board P, system board S and I/O board I are detailed below.

This is noted to be an exemplary and preferred embodiment of the computer system C and it is understood that numerous other embodiments, such as having all of the components on a single system board or mother board as is common, could be readily developed.

Figure 2:
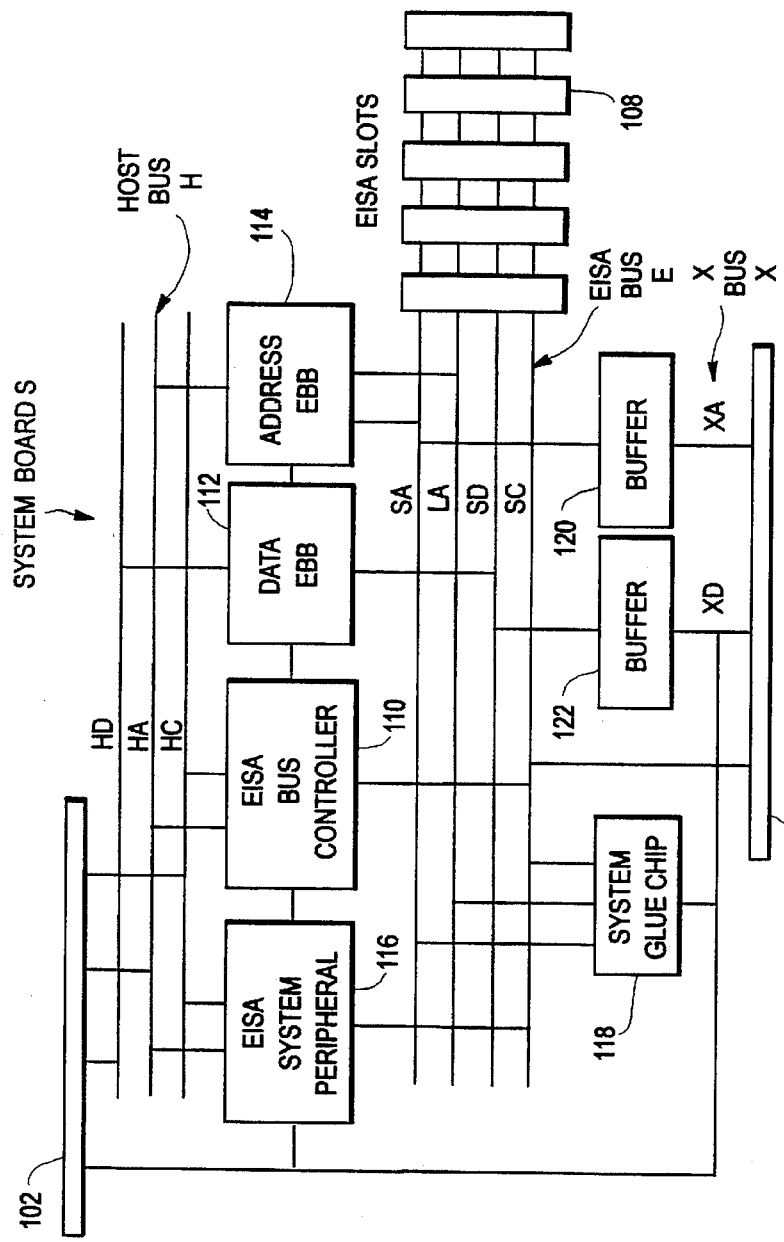
FIG. 2 is a block diagram of the system board of FIG. 1.

Referring now to FIG. 2, a block diagram of the system board S is shown. Two main buses, a host bus H and an Extended Industry Standard Architecture (EISA) bus E, form the logical back bones of the system board S. The host bus H has three components, the host data or HD bus, the HA or host address bus and the HC or host control bus. Preferably the HD bus is 32 bits wide and the HA bus is provided for a 32 bit addressing space. Preferably the host bus H operates substantially according to an 80486 protocol, but including capabilities for pipelining as in the 80386. The EISA bus E has four major components, the SA and LA or system and early address buses, the SD or system data bus and the SC or system control bus. A plurality of EISA slots 108 are connected to the EISA bus E. An EISA bus controller 110 such as the Intel 82358, provides the necessary capabilities to convert between host bus H cycles and EISA bus E cycles and is connected between the HA and HC buses and the SC bus. The EISA bus controller 110 is connected to control a data EBB or EISA bus buffer 112, which provides the necessary data transceiving functions between the host bus H and the EISA bus E and provides the data assembly and disassembly requirements of an EISA system. Similarly, the EISA bus controller 110 provides the control function for an address EISA bus buffer or EBB 114. The address EBB 114 provides transceiving capabilities between the EISA bus E and the host bus H and in addition latches the HA bus signals to form the SA bus signals as appropriate.

The computer C includes certain fundamental components such as an interrupt system, a dynamic memory access (DMA) controller and a number of timers, as well as arbitration of the EISA bus E. These components are all contained in the EISA system peripheral 116, which is connected to the HA, HC and SC buses. A chip referred to as the system glue chip 118 is connected to the EISA bus E and to a bus referred to as the XD or X data bus and performs numerous miscellaneous functions necessary in the computer system C.

Finally, a third bus, referred to as the X bus X, is provided to the connector 104. The X bus X has address XA, data XD and control SC portions. The XA lines are developed from the SA bus by means of a buffer 120, while the XD bus is formed from the SD bus by means of a buffer or transceiver 122. Preferably the XD bus is 16 bits wide, while the XA bus is the same width as the SA bus. The host bus H and the XD bus are provided to the connector 102 for provision to the processor board P. In addition, the XD bus is connected to the EISA system peripheral 116.

Figure 3:
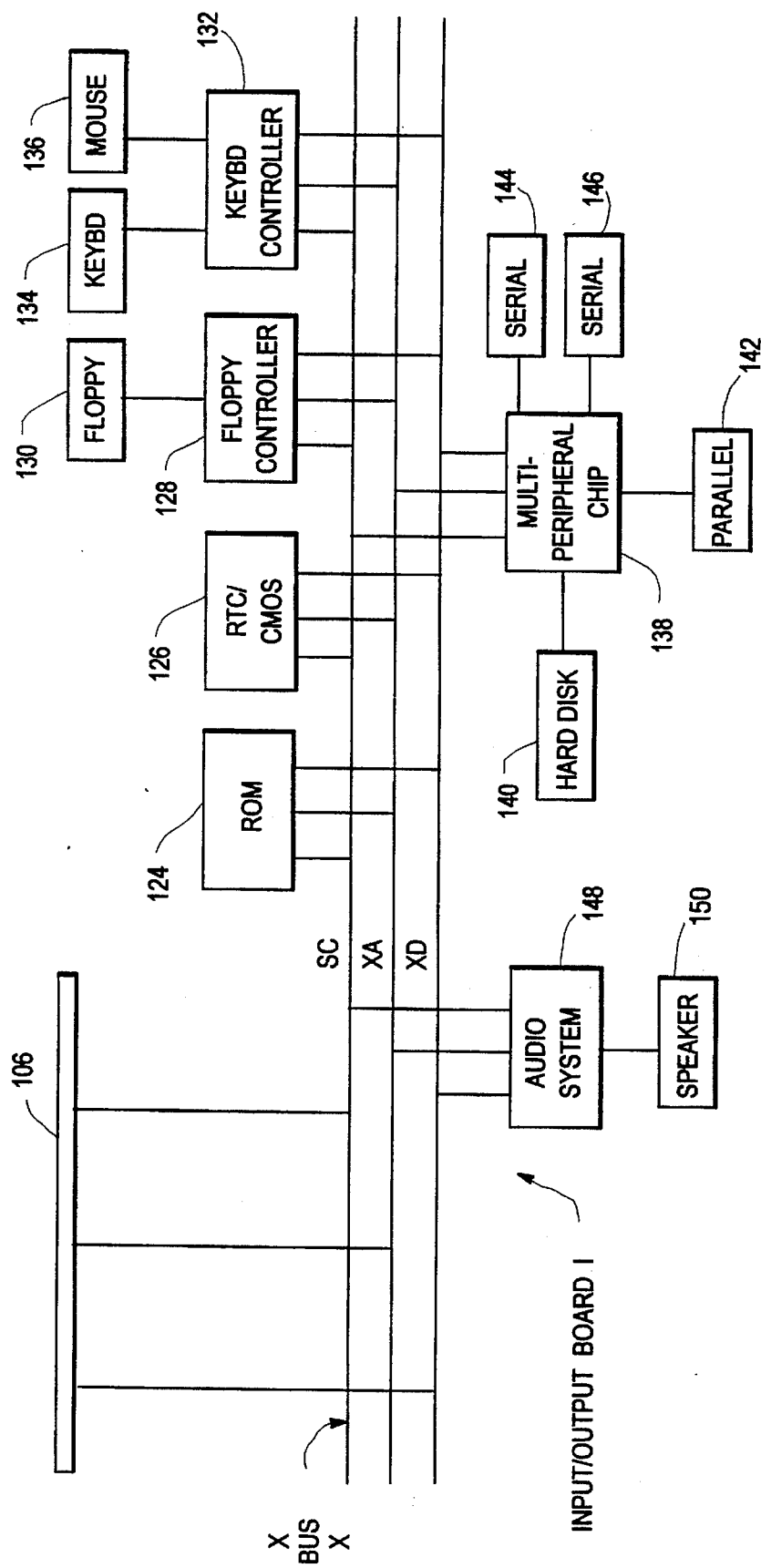
FIG. 3 is a block diagram of the input/output board of FIG. 1.

Referring now to FIG. 3, the I/O board I is shown in more detail. The backbone of the I/O board I is the X bus X. Connected to the X bus X is a ROM or read only memory 124, which contains the basic operating sequences of the computer system C. The ROM 124 is preferably a flash erasable programmable read only memory (EPROM) to allow ease of changing of the basic operating sequences. A real time clock (RTC)/CMOS unit 126 is connected to the X bus X to provide real time clock functions and longer term memory capabilities. A floppy disk controller 128 is connected to the X bus X and receives a floppy disk unit 130. A keyboard controller 132, typically an 8042 device, is connected to the X bus X and receives a keyboard 134 and a mouse or pointing device 136. A multiple peripheral chip 138 is connected to the X bus X and provides an interface to a hard disk unit 140, a parallel port 142 and two serial ports 144 and 146. Finally, an audio system 148 is connected to the X bus X to provide audio functions, with a speaker 150 connected to the audio system. Other components could be provided on the I/O board I if desired. Preferably, the graphics system in the preferred computer system C is provided on a separate add in card located in an EISA slot 108 and is not necessarily located on the I/O board I.

Figure 4:
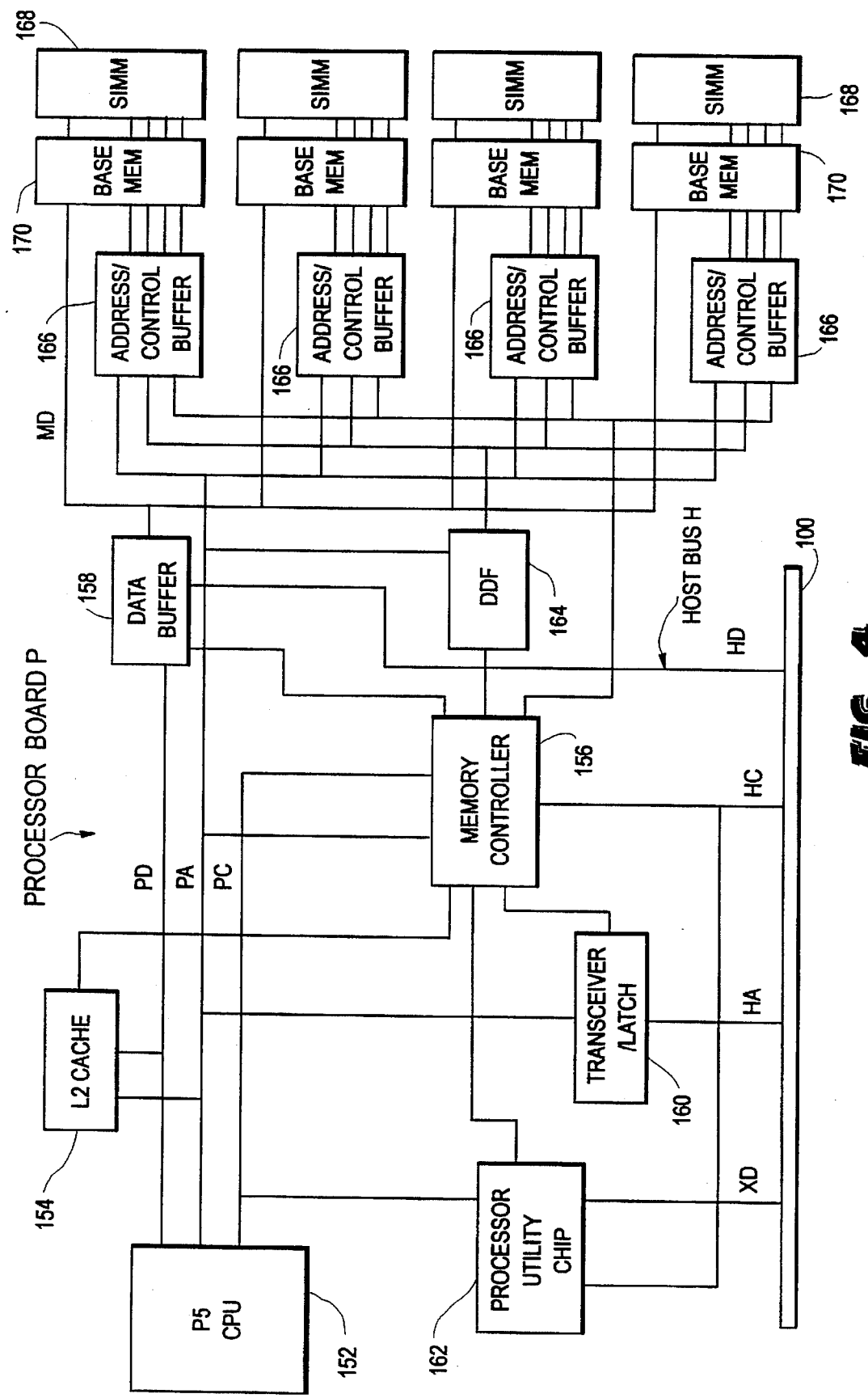
FIG. 4 is a block diagram of the processor board of FIG. 1.

Referring now to FIG. 4, the processor board P is shown in more detail. The primary component on the processor board P is the processor or CPU 152, in the preferred embodiment preferably the P5 or Pentium microprocessor from Intel Corp., the next generation design after the 80486. In the preferred embodiment the 66 MHz version is utilized. Operation and interfacing of the 80386 and 80486 are assumed to be familiar to the reader. The P5 is a very high performance microprocessor having a superscalar architecture and integrated and separate code and data caches. The data bus is 64 bits wide and 8 parity bits are provided. The data cache is a write-back design having a 64 byte line width. Many of the signals of the P5 have a similar function as in the 80386 and 80486 and only those signals have a changed or new function will be described in detail herein. One signal is CACHE, which is used to indicate whether the cycle is cacheable by the processor 152. An additional signal used to indicate cacheability is the PCD or page cache disable signal, which is used to disable caching of selected pages of memory. If the CACHE signal is present and the PCD signal is not asserted during a read or write cycle, they are burst cycles, namely cache line fill or write-back. Further, the P5 has only a PBRDY* or processor burst ready input and does not have a PRDY* or single cycle ready input, so the PBRDY* input is used for all ready indications to the processor 152. The P5 does include a PNA, or next address input to allow address pipelining. One additional feature in the P5 is System Management Mode or SMM. This is similar to that in the Intel 80386SL and 80486SL processors. An SMI pin is used to enter SM mode and a signal referred to as SMIACT* is provided to indicate operation in SM mode.

Three buses are connected to the P5 CPU 152, the PD or processor data bus, the PA or processor address bus and the PC or processor control bus. A level two (L2) or external cache 154 is connected to the PD and PA buses and receives control signals from a memory controller 156. In the preferred embodiment the memory controller 156 is a single ASIC which contains the memory controller functions and additionally includes the cache controller capabilities necessary to operate the L2 cache 154.

A data buffer 158 is connected to the PD bus and develops two new buses, the HD or host data bus and the MD or memory data bus. The HD bus is connected to the connector 100 for connection to the system board S. The data buffer 158 is controlled by the memory controller 156. A transceiver/latch unit 160 is connected between the PA bus and the HA bus to provide latching and transceiving capabilities of addresses between the P5 CPU 152 and the host bus H. The transceiver/latch 160 is controlled by the memory controller 156 to allow posting of cycles from the processor bus to the host bus H.

A processor utility chip 160 provides certain necessary utility operations for use with the CPU 152. The processor utility chip 162 is connected to the XD bus and the HC bus and is controlled by the memory controller 156. The output of the processor utility chip 162 is preferably provided to the PC bus to provide control functions of the P5 CPU 152.

The memory controller 156 is also connected to a unit referred to as the DDF or data destination facility 164. The DDF 164 performs memory module enabling, address translation and memory segment or page property storage. The DDF 164 provides memory capabilities to indicate which particular bank of memory is to be enabled, performs address translation on a 128 kbyte boundary and provides indications of certain characteristics of each 128 k block, such as whether it is located in the main memory on the processor board P or is external, write protected, high speed, and/or cacheable and whether that portion can be utilized by a write-back cache. Operation of the DDF 164 is more completely explained in U.S. Pat. No. 5341,494, and E.P.O. Application 0 426 386, publication date May 8, 1991, both of which are hereby incorporated by reference. The outputs of the DDF 164 are a series of RASEN or RAS enable signals for enabling a particular memory module, certain translated addresses to indicate the address bits above 128k, and the page characteristic bits, such as HNCA, HCW, HWP, PLOCMEM*, and SPD60.

The memory portion of the processor board P is provided as four identical modules, each module containing an address/control buffer 166, one sockets for receiving an individual single in-line memory module (SIMM) unit 168 and base memory 170. The address/control buffer 166 receives the PA bus, the address and enable outputs of the DDF 164 and control signals from the memory controller 156. The outputs of the address/control buffer 166 are the addresses provided to the SIMMs 168 or base memory devices 170 and the RAS*, CAS* and WE* signals. These signals are provided to each of the SIMMs 168 and the base memory devices 170. The address/control buffer 166 operates to provide the RAS*, CAS* and WE* signals to the proper memory devices. The address/control buffer 166 uses the MRAS*, REFRESH* and RASEN<1..0> signals to decode and provide the four individual RAS* signals, namely RASA*<1..0> and RASB*<1..0>, of the preferred embodiment. Similarly, the address/control buffer 166 uses the MCAS*, PBE* and MALLBES* signals to select specific bytes of memory, which are activated using the CAS* signal, namely CASA*<3..0> or CASB*<3..0> signals. More details on the operation of the address/control buffer 166 are provided in Ser. No. 08/034/287, entitled MEMORY CONTROLLER HAVING ALL DRAM ADDRESS AND CONTROL SIGNALS PROVIDED SYNCHRONOUSLY FROM A SINGLE DEVICE, which is filed concurrently herewith and is hereby incorporated by reference. Additionally, each SIMM 168 or base memory device 170 is connected to the memory data bus MD. As indicated, there are four like modules. Other configurations of the processor board P could be developed, with variations obvious to one skilled in the art, with certain details provided below.

Figure 5:
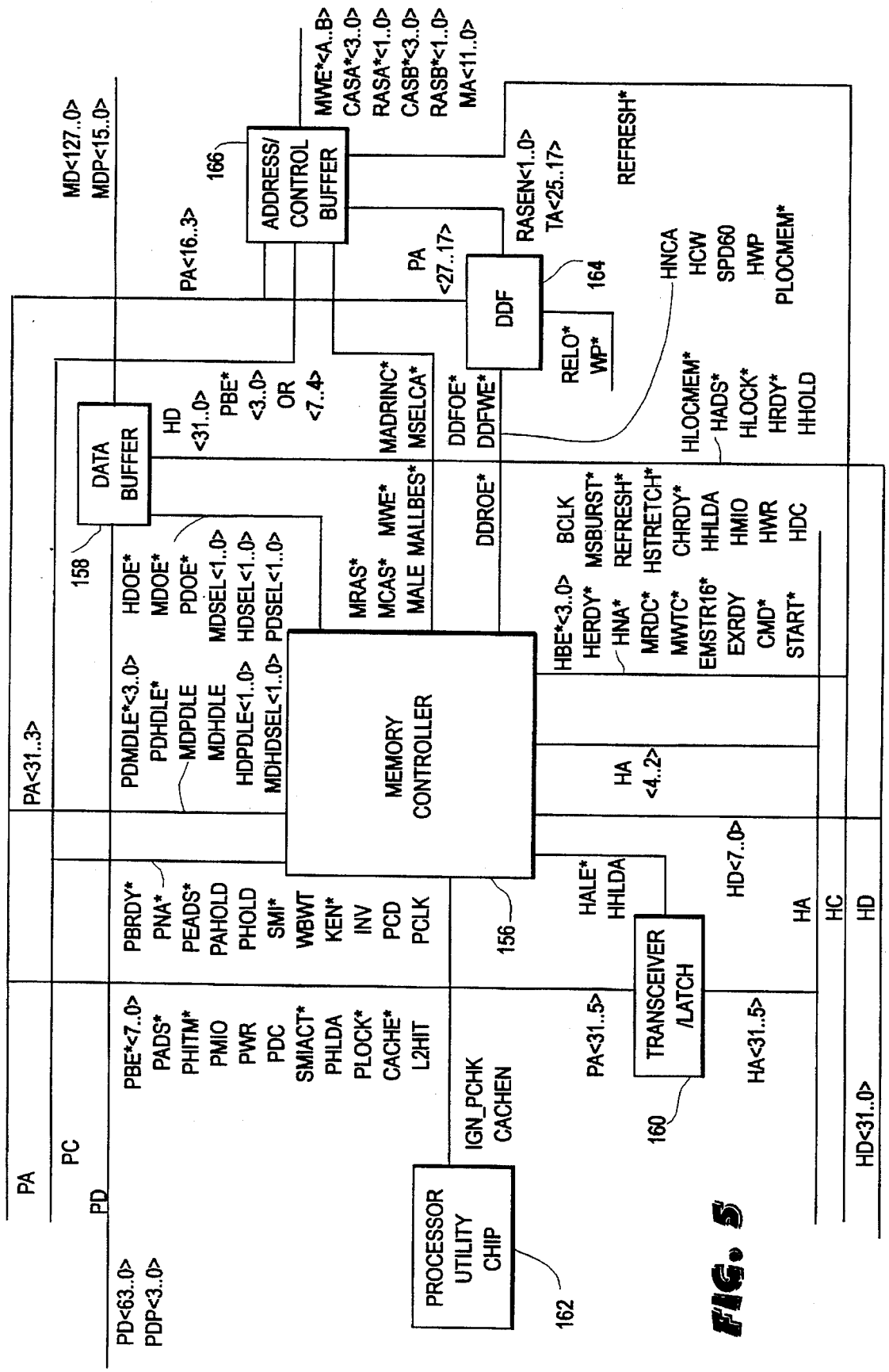
FIG. 5 is a more detailed block diagram of portions of the processor board of FIG. 4.

Referring now to FIG. 5, the various control signals utilized by or provided by the memory controller 156 are shown, with their appropriate connections to the related bus or block. FIG. 5 is useful for an overview of the connections of the memory controller 156 to the remaining components of the computer system C.

Figure 6:
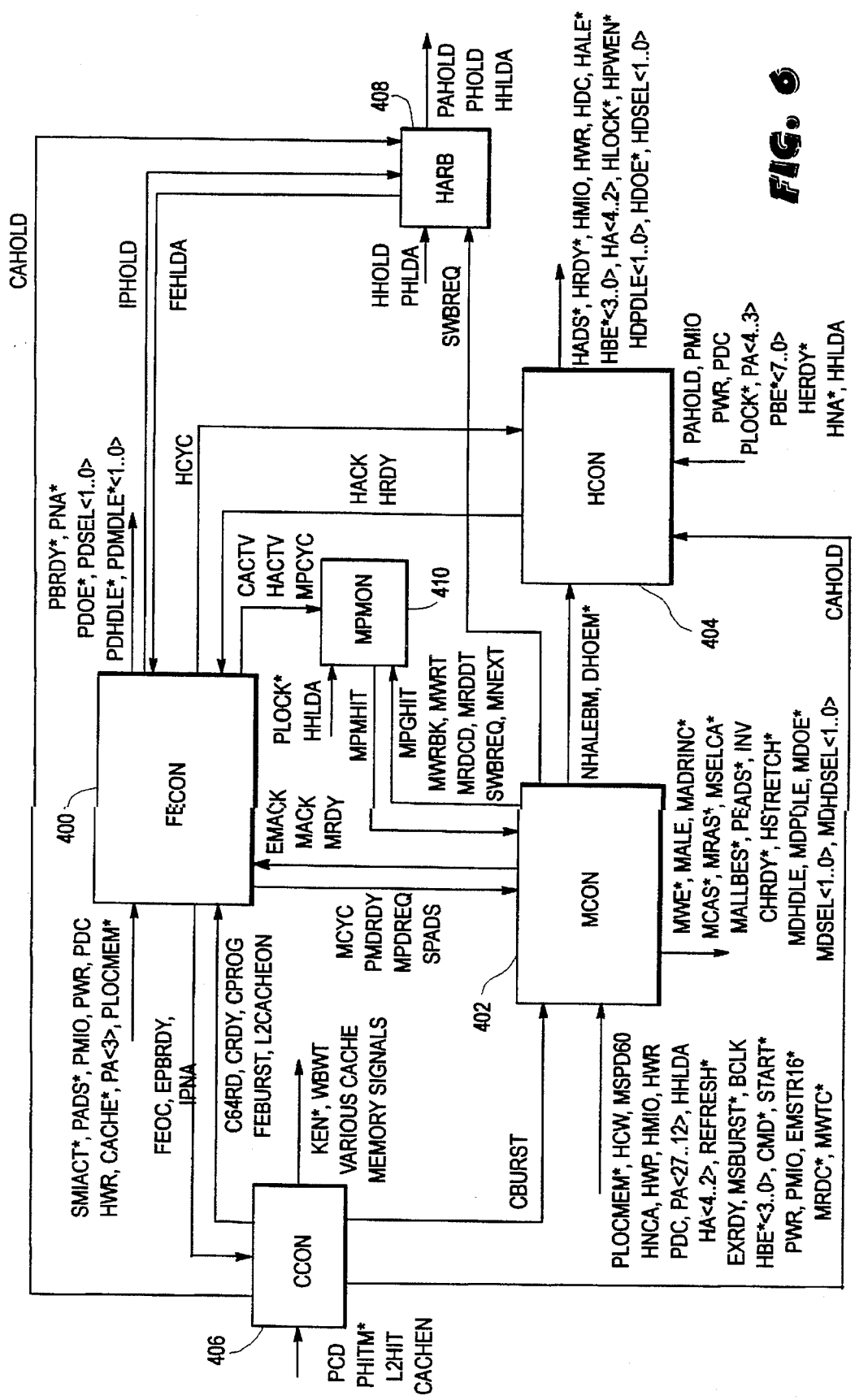
FIG. 6 is a block diagram of the major portions of the memory controller of FIG. 4.

Referring now to FIG. 6, portions of the memory controller 156 are shown. Preferably the memory controller 156 is organized as a series of interdependent blocks. Each of these blocks is logically organized to relate to a particular external unit, such as the L2 cache 154, the processor 152, the memory, the host bus H or arbitration, to which it is related. A first block is referred to as FECON or the front end controller 400. The FECON block 400 interacts with the processor 152 for receipt of cycle start signals from the processor 152 and provides signals which activate the MCON block 402 and the HCON block 404. Similarly, the FECON block 400 provides completion signals to the processor 152 when appropriate upon receipt of handshake signals from the MCON block 402 and the HCON block 404. The FECON block 400 also provides signals to the data buffer 158 to latch processor write data and enable processor read data. The MCON block 402 is the second major block and is the memory controller portion. The MCON block 402 interfaces with the address/control buffers 166 to provide the necessary control signals and the data buffer 158 to latch data from the memory and enable data to the memory. The HCON block 404 is the host bus control block and interfaces with the host bus H to provide the necessary signals for its operation. The HCON block 404 further communicates with the data buffer 158 to latch data from the host bus H and enable data to the host bus H. Both the MCON block 402 and the HCON block 404 have handshake communications.

A CCON block 406 is the L2 cache controller and interfaces with the FECON block 400 and the cache 154 to provide complete cache controller functions. Preferably the cache controller is a 256 kbyte, direct mapped, write through, lookaside cache for simplicity of logic and operations. A block 408 referred to as HARB or host arbitration block interfaces with the FECON block 400 to provide processor and host bus arbitration. The final block shown in FIG. 6 is the MPMON block 410 or memory performance monitor. In memory controller 156 of the preferred embodiment the memory performance monitor 410 is utilized to determine the state of the MRAS, signal at the end of a memory cycle. Effectively the MPMON block 410 is performing next operation prediction so that the MRAS* signal can be properly held low or raised high, depending upon whether the next operation has a probability of being a memory page hit or memory page miss. More of this will be described with the state machines described below.

Another block not shown in FIG. 6 for simplicity is the DDFCON or data destination facility control block. This is omitted for simplicity but provides the necessary and conventional signals to operate with the DDF 164 to allow it to be programmed and read. This operation will be apparent based on the operation of the FECON 400 and upon examination of the referenced "Data Destination Facility" application.

Preferably the FECON block 400, MCON block 402 and HCON block 404 are comprised of a plurality of state machines, each acting independently and interdependently, and certain loose logic. Each state machine receives certain signals to commence its operation and proceeds according to the receipt of other signals. The various tasks necessary for the memory controller operation are split between these numerous state machines and between the control blocks as indicated, to allow pipelining and multiple concurrent cycles without requiring an overly complex single master state machine. By the use of the plurality of individual state machines each operation is allowed to proceed at its greatest possible rate, stopping only when another signal or information is necessary to allow it to proceed. This arrangement and operation will become apparent as the numerous state machines are described below and by reference to include timing diagrams. A number of these signals provided and utilized internal to the memory controller 156 and between the various control blocks are shown in FIG. 6. The listing is not necessarily complete but shows the more important signals. Further details of the CCON or cache controller 406 will not be provided as it is not particularly relevant to this operation except as necessary when certain cache operations are occurring.

A more detailed understanding of the memory controller and system described in the preceding figures can be found in U.S. patent application Ser. No. 08/034/290, entitled "Fully Pipelined and Highly Concurrent Memory Controller", filed concurrently herewith, which is incorporated herein by reference. In the description of the memory performance monitor MPMON block 410 that follows, the generation of certain signals has been omitted as being not critical to the functioning of the memory performance monitor according to the invention. These signals are more fully disclosed in the referenced patent application.

Figure 8A:
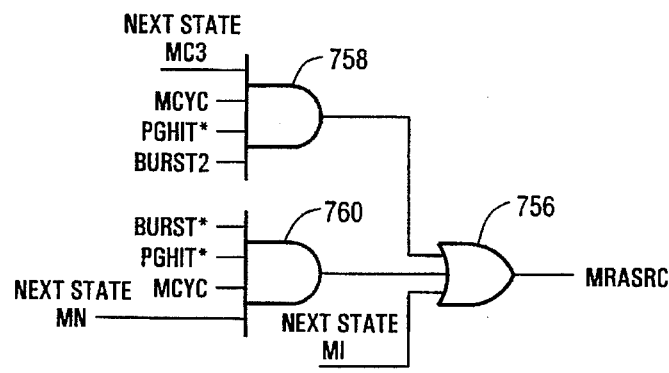

The MEM or memory state machine for the memory control block MCON 402 is shown in FIG. 8. The state machine is clocked by the PCLK signal, the 66 MHz signal provided to the processor 152. Control proceeds to state MI or memory idle upon reset. In this state the state machine is idle and is precharging the DRAMs and the MRAS* signal is high. Control proceeds from state MI to state MRC if the MCYC signal is active, indicating that a memory cycle is being requested, and the CHGTO* or not charge time out signal is asserted, indicating that the DRAMs have not been fully precharged. Control proceeds from state MI to state MR1 or memory RAS1 if a cycle has been requested, as indicated by the MCYC signal, and the CHGTO signal is true, indicating that the precharge time has completed.

Control proceeds from state MI to state MN when the BMPROG or bus master cycle in progress signal is asserted. In all other cases control remains at state MI. Control proceeds from state MRC to state MR1 when the CHGTO signal is active, indicating that the precharge time has been completed. Control proceeds from state MR1 to state MR2 in all cases. Control proceeds from state MR2 to state MC1, the first of the CAS states, if the DRAMs have a speed of 60 ns, as indicated by the LSPD60 or latched SPD60 signal from the DDF 164, and either a read cycle has been indicated or the PMDRDY, or processor to memory data ready signal is active. The PMDRDY signal indicates to the memory control section that the write posting buffer has been filled. Control proceeds from state MR2 to state MR4 for 60 ns DRAMs if a write cycle has been requested and the PMDRDY signal is not asserted. In all other cases control proceeds from state MR2 to MR3. Particularly, control proceeds from state MR2 to MR3 in the case of 80 ns DRAMs. Control proceeds from state MR3 to state MR4 in all cases. Control proceeds from MR4 to state MC1 if either a read cycle has been requested or the data is available as indicated by the PMDRDY signal. Control remains at state MR4 for all other cases.

Control always proceeds from state MC1 to state MC2. Control proceeds from state MC2 to state MC3 when the MPDREQ signal is asserted, indicating that the FECON block 400 is ready to accept data from the memory. In all other cases control remains at state MC2. Control always proceeds from state MC3 to state MN.

There are numerous exits from state MN. In state MN the MRAS* signal is low. Control proceeds from state MN to state MC1 if a burst cycle is occurring, if a non-burst memory page hit read has occurred as indicated by the MCYC, BURST*, MWR* and PGHIT signals being true or if the next cycle is a non-burst memory page hit, the previous cycle was a memory write, and the data is available, as indicated by the MCYC signal, BURST*, PGHIT, PMDRDY and PRMWR signals being asserted. The PRMWR signal indicates the previous memory cycle is a write cycle. This loop from state MN to state MC1 is the shortest loop and indicates a two wait state loop based on a 66 MHz clock. Thus, once page hits are obtained, the memory controller 156 can operate in one wait state per memory cycle mode for most page hit operations. Control proceeds from state MN to state MR4 on non-burst memory page hit writes where the data is not available, as indicated by the MCYC, BURST*, MWR, PGHIT and PMDRDY* signals being true. Control also proceeds from state MN to state MR4 if it is a non-burst, memory page hit with a write following a read operation, as indicated by the MCYC, BURST*, MWR, PGHIT and PRMWR* signals being true. Control proceeds from state MN to state MRC if another cycle has been requested and it is a non-burst, non-page hit, as indicated by the MCYC, BURST* and PHGHIT* signals being true. Control proceeds from state MN to state MI if an idle state is needed for non-burst, non-bus master cycles, non-memory cycles either because the memory performance monitor has indicated that the next cycle probably will not be a page hit and therefore it is appropriate to proceed to precharge the DRAMs to see if time can be sawed in the case of a page miss, or if a hold request has been acknowledged by the processor 152. These conditions are indicated by the MCYC*, the BURST* signal, and the BMPROG* signals being true and either the HHLDA or MPM__HIT* signals. In all other cases control remains at state MN, which is thus effectively a second idle state, only in this case the MRAS* signal is held low. Particularly, if the memory performance monitor indicated that the next state is likely to be a page hit by asserting MPM__HIT, control remains at state MN, awaiting the hit and a transfer to states MC1 or MR4.

Figure 7:
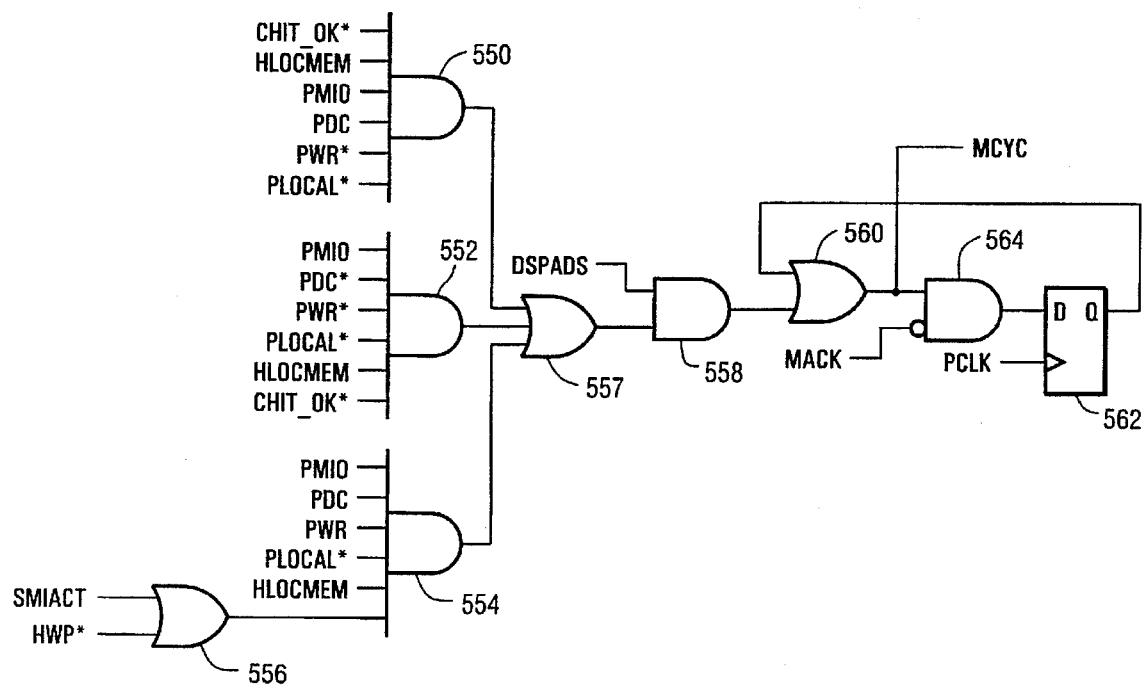
FIGS. 7, 7A, and 8A are schematic diagrams of portions of the memory controller of FIG. 4 used with various state machines.

As indicated in FIG. 6, the MCYC signal is provided to MCON block 402. This decoding is done by certain logic shown in FIG. 7. A six input AND gate 550 receives the PMIO, PDC, PWR*, PLOCAL*, CHIT__OK* and HLOCMEM signals to decode a main memory data read cycle which is not an L2 cache 154 hit. A six input AND gate 552 receives the PMIO, PDC*, PWR*, PLOCAL*, HLOCMEM and CHIT__OK, signals to decode a memory command read cycle which is not a L2 cache 154 hit. A six input AND gate 554 receives the PMIO, PDC, PWR, PLOCAL* and HLOCMEM signals and the output of a two input OR gate 556 which receives the SMIACT and HWP* signals. Thus this AND gate 554 decodes a memory data write cycle to main memory. It is noted that the SMIACT and HWP* signals are ORed in the OR gate 556. This is done so that areas of memory which are normally write protected, such as the system management memory, are not write protected during system management mode. Thus an area of conventional memory can be utilized as the SMM area without danger of if being overwritten and yet it is fully accessible during SMM mode.

The outputs of the AND gates 550, 552, 554 are provided to the inputs of a three input OR gate 557 whose output is provided as one input to a two input AND gate 558. The second input of the AND gate 558 receives the DSPADS signal, or delayed synchronized processor ADS signal. The SPADS signal is the ADS* signal from the processor 152 which has been synchronized to the PCLK signal and inverted. The DSPADS signal is the SPADS signal delayed one PCLK signal cycle. The output of the AND gate 558 is provided as one input to a two input OR 560, whose second input receives the noninverted output of a D-type flip-flop 562. The output of the OR gate 560 is the MCYC signal and is provided to the input of a two input AND gate 564. The second input of the AND gate 564 is inverted and receives the MACK signal. The output of the AND gate 564 is provided to the D input of the flip-flop 562, which flip-flop 562 is clocked by the PCLK signal.

Figure 7A:
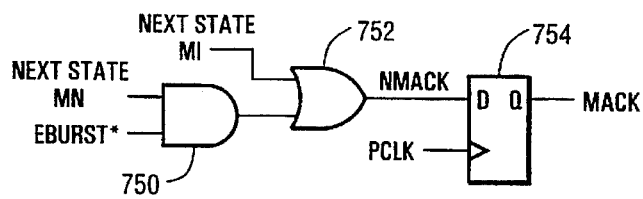

The MACK or memory acknowledge signal is developed as shown in FIG. 7A. A signal indicating that the next state of the MEM state machine is state MN and the EBURST* signal are provided to the input of an AND gate 750. The output of the AND gate 750 is one input to an OR gate 752 whose other input is a signal indicating that the next state of the MEM state machine is state MI. The output of the OR gate is the NMACK signal is provided to the D input of a flip-flop 754. The flip-flop 754 is clocked by the PCLK signal and has the MACK signal as its noninverted output.

The MRAS, or master RAS, and MRAS* signals are provided at the outputs of a JK flip-flop which receives at its J input of the MRASSC signal and at its K input the MRASRC signal and is clocked by the PCLK signal. The MRAS* signal is used to drive the various RAS* signals to the memory banks, and subsequent logic latches and decodes the individual lines. MRAS* is the signal used to precharge the DRAMs, and this is the signal that is selectively taken high when MPMON predicts a page miss. The MRASSC or master RAS set signal from the CPU section is the same as the signal indicating that the next state of the MEM state machine is state MR1. The MRASRC or master RAS reset from the CPU signal is shown as the output of a three input OR gate 756 in FIG. 8A. The next state MC3, MCYC, PGHIT*, and BURST2 signals are provided to an AND gate 758. The BURST*, PGHIT*, MCYC, and next state MN signals were provided to an AND gate 760. The outputs of the AND gate 758 and 760 are provided as inputs to the OR gate 756, along with a signal that indicates that the next state of the MEM state machine is state MI.

Figure 9:
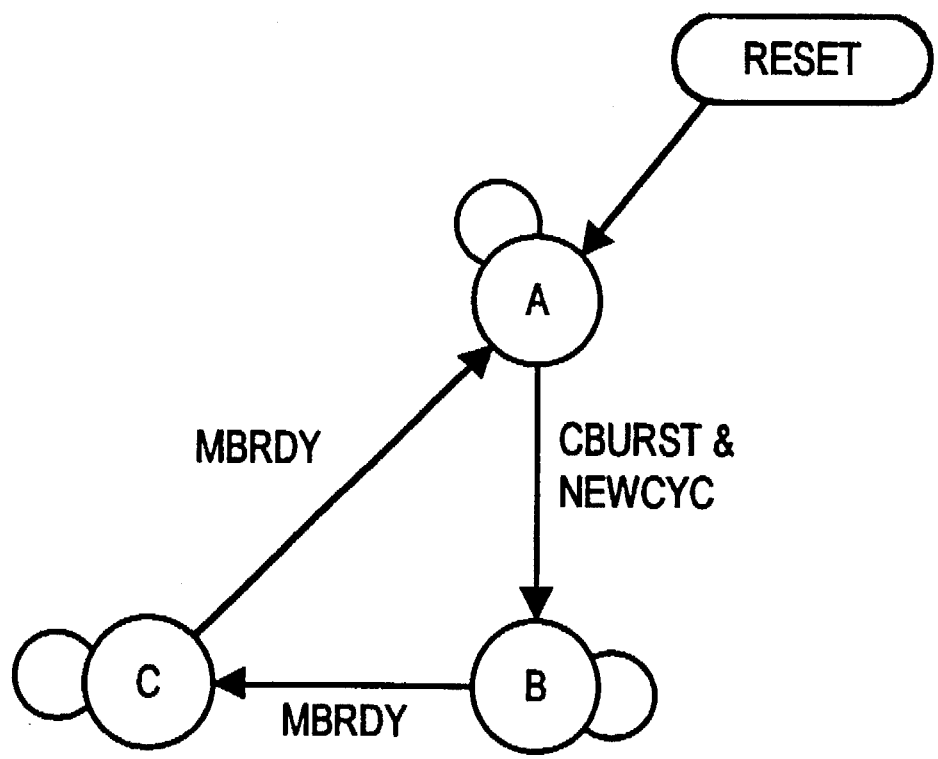

As noted, the MEM state machine needs to know whether a burst is occurring. This will also be required by the memory performance monitor MPMON block 410. This information is provided by the BURST state machine shown in FIG. 9. This state machine beings operation at state A upon reset and proceeds to state B if a cache burst operation is occurring and a new cycle is being developed, based on the NEWCYC and CBURST signals. The NEWCYC signal is the AND of the MACK and MCYC signals, while the CBURST signal indicates a processor 152 write-back or L2 cache 154 send allocate line fill. In all other cases control remains at state A. Control proceeds from state B to state C when the MBRDY signal is received from other logic not shown to indicate that 128 bits of data had been transferred to the memory system. Otherwise control remains at state B. Control proceeds from state C back to state A on the next occurrence of the MBRDY signal and otherwise remains at state C. Thus, once the beginning of a new burst cycle is indicated, control proceeds from state B to state C as data is transferred. The BURST signal is thus asserted during states B and C, while the BURST2 signal is asserted in state C and the EBURST signal is provided in state B.

The CHGTO or precharge timeout signal is provided by a simple counter. The counter is loaded with a default value of 4 whenever the MRAS signal is being asserted. Assertion of this signal is described below. On each rising edge of the PCLK signal when the MRAS signal is deasserted, that is the MRAS* signal is high, the counter counts down. When the counter reaches a value of 1, this is an indication that the precharge time has been completed for 60 ns DRAMs. When the counter counts down to 0, this is an indication that the precharge time has completed for 80 ns DRAMs. Therefore the CHGTO signal is provided after three counts for 60 ns DRAMs and four counts for 80 ns DRAMs from the beginning of the MRAS* signal deassertion.

The PGHIT or page hit signal is provided by a page hit detection block. This is relatively conventional block in that it contains a latch for processor address <27..12> bits, with the latch operating on the processor memory address latch enable signal, which is active when addresses are being provided to the memories. The outputs of the latch are provided to one input of a comparator, while the active or current processor address <27..12> bits are provided to the second input of the comparator. If they are equal, this is considered to be a page hit operation, so that a new row address need not be provided.

Figure 10:
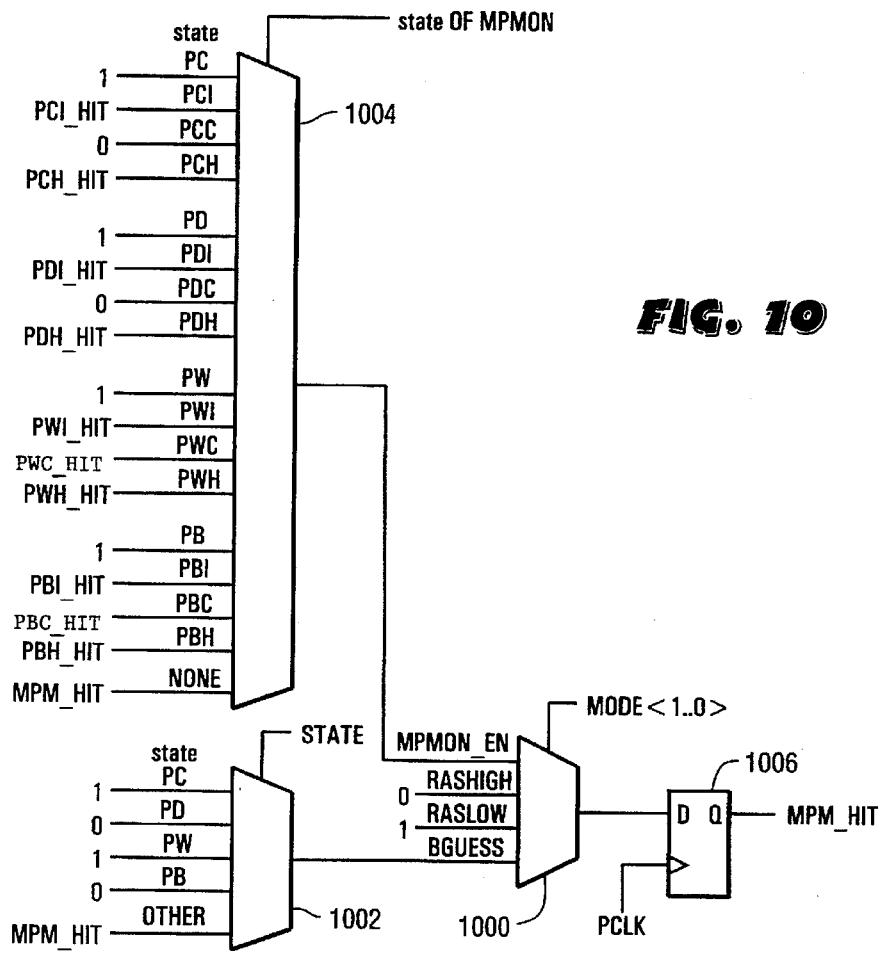
FIGS. 10–11 and 14 are schematic diagrams showing a memory controller's DRAM page hit and precharge prediction circuitry.

FIG. 10 shows a group of multiplexers used to generate the MPM_HIT signal shown in FIG. 8. The MPM_HIT signal is used to selectively begin a RAS precharge based on the previous memory cycle of the system and upon the pending cycle of the system. The MPM_HIT signal, when high, indicates that the MPMON block 410 state machine has predicted a page hit, and thus there is no need for a precharge. This state machine will be described in the discussion of FIGS. 12 and 13. When MPM_HIT goes low, however, that indicates that the MPMON block 410 is predicting the next memory request will not be a page hit, and therefore the memory state machine MEM shown in FIG. 8 should precharge the RAS's by going to cycle MI. FIG. 10 shows a mode selection multiplexer 1000, which allows the computer system C to choose which MPMON mode it will run in. There are four modes, which are selected by the MODE (1..0) signals. The RASHIGH mode indicates that after every memory access, MPMON predicts the next access will be a page miss.

This forces the MEM state machine of FIG. 8 to proceed from the MN state to the MI state when the next cycle is not known, that is, when MCYC is false, as MPM_HIT, is always low in the RASHIGH mode. When the next memory cycle has begun executing, and thus MCYC is high, the next address is used to predict whether or not a page hit will occur. In such a case, the MPMON block 412 and MPM_HIT are ignored, as it would make no sense to predict whether or not the next memory access cycle will be a page hit when an address is currently available to make that determination right away.

Returning to FIG. 10, the RASLOW mode indicates that MPMON always predicts the next memory access will be a page hit. In such a case, MPM_HIT is always high, and thus that signal will not force the MEM state machine from state MN to state MI.

The BGUESS, or best guess, mode is slightly more sophisticated. The four types of memory accesses that can occur are memory code read (PC), memory data read (PD), memory single write (PW), and cache line write back (PB). A guess multiplexer 1002 provides the BGUESS signal to the mode selection multiplexer 1000, which is based upon a best guess algorithm. When this algorithm is used, the MPMON block 410 predicts a page hit, and thus sets MPM_HIT high, when a code read (PC) cycle or a single write cycle (PW) is executed. Similarly, MPM_HIT is set low when a data read cycle (PD) is executed or a cache line write back (PB) cycle is executed. This is based upon a rationale that code reads and single writes are more likely to result in a page hit on the next access than are data reads and cache line writebacks.

A dynamic multiplexer 1004 provides a signal to the mode multiplexer 1000 for use when the memory performance monitor is enabled. The dynamic multiplexer 1004 uses an even more sophisticated system for predicting whether the next memory access will be a page hit. In this algorithm, MPM_HIT is turned on or off based upon the type of cycle last memory access was in conjunction with what type of cycle is pending. Again, if a memory cycle is currently being executed, indicated by the signal MCYC, then no prediction need be made, as an address is available and it is known whether a page hit has occurred.

There are three distinct nonmemory access states that can follow a memory cycle: an idle state (resulting from coming out of pipeline), a L2 cache hit state, and a host bus access state. Thus, a prediction is made of whether the next memory cycle will be a cache hit by examining the last executed memory access type; that is, a code read, a data read, a single data write, or a cache line write back, and determining what is the pending nonmemory type of cycle; that is, an idle state, L2 cache hit, or a host bus access. Thus, there will be a total of 12 distinct possibilities.

The memory performance monitor according to the invention keeps track of each of these combinations, and for each one, after a predetermined number of these combinations has occurred, the number of page hits that have occurred is compared to a threshold.

These thresholds were developed based on estimates of cycle mixes, as provided by the processor manufacturer or as by experience, combined with the penalties developed for an erroneous selection. The penalties are dependent upon the memory controller design, memory speed and other factors. Thus the thresholds will vary from system to system, and indeed from program to program.

A certain number of occurrences must first pass before this threshold comparison is made, but at that point, whenever that combination again occurs, the MPMON block 410 then sets the MPM_HIT signal according to that comparison, as long as the mode set in the mode multiplexer 1000 is set for MPMON_EN mode. Through empirical testing, the preferred values for the thresholds for these combinations has been determined, and is shown in the following table. These thresholds may well be different for various applications and other hardware, however, and although they are hardwired into the preferred embodiment, they could easily be made software adjustable.

| Current Cycle | Pending Cycle | Threshold | Threshold Register (Binary) |
|---|---|---|---|
| Data Read | none | 73% | 1011_1010 |
| Burst | L2 Read | 100% | not needed |
| | Host Cycle | 73% | 1011_1010 |
| Code Read | none | 73% | 1011_1010 |
| Burst | L2 Read | 100% | not needed |
| | Host Cycle | 73% | 1011_1010 |
| Single Write | none | 70% | 1011_1010 |
| | L2 Read | 79% | 1100_1001 |
| | Host Cycle | 70% | 1011_0011 |
| Writeback | none | 67% | 1010_1011 |
| | L2 Read | 91% | 1110_1000 |
| | Host Cycle | 70% | 1011_0011 |

The dynamic multiplexer 1004 has inputs which are selected by the current state of the MPMON state machine, which will be described in relation to FIGS. 12 and 13. These states are based on the base states of PC, PD, PW, and PB, which are entered into whenever the associated memory cycle is entered. Further, there are 12 substates which are entered when that base state in which the state machine is in is followed by an idle, an L2 cache read, or a host bus cycle. This will be further described in relation to FIGS. 12 and 13. As inputs into the dynamic multiplexer 1004, whenever a particular state is enabled, a hit signal associated with that state is routed to the MPMON_EN input of the mode multiplexer 1000. When the state is simply a base state, such as PC, PD, PW, or PB, the MPMON block 410 does not yet want to predict a page miss. When the mode is one of the 12 substates, excluding PCC and PDC, then the appropriate hit signal for that substate is routed through the dynamic multiplexer 1004. The generation of this hit signal will be understood in the discussion related to FIG. 11, but generally the hit signal is a result of the comparison between the number of hits when that combination has occurred, compared to the threshold register which sets whether to indicate a page hit or page miss prediction.

Note that after a data read or code read, if the pending cycle is an L2 read, MPM_HIT is always set low. This can be seen in FIG. 10, as PCC and PDC are zero going in the dynamic multiplexer 1004, thus forcing MPM_HIT low when these combinations occur. This is so because a cache burst hit operation is occurring and the cycle is pipelined, so that the next cycle's address will be provided early, and thus a RAS precharge is "free," as the cache read will be occurring while the RAS precharge and the RAS signals are driven to the memory chips.

In FIG. 10, if none of the states of the dynamic multiplexer 1004 or the BGUESS multiplexer 1002 are hit, the previous MPM_HIT state is used. Finally, the MPM_HIT signal is not a direct output, but is instead clocked out through the flip-flop 1006 by PCLK, which is simply the system clock signal running at 66 Mhz in the preferred embodiment.

Figure 11:
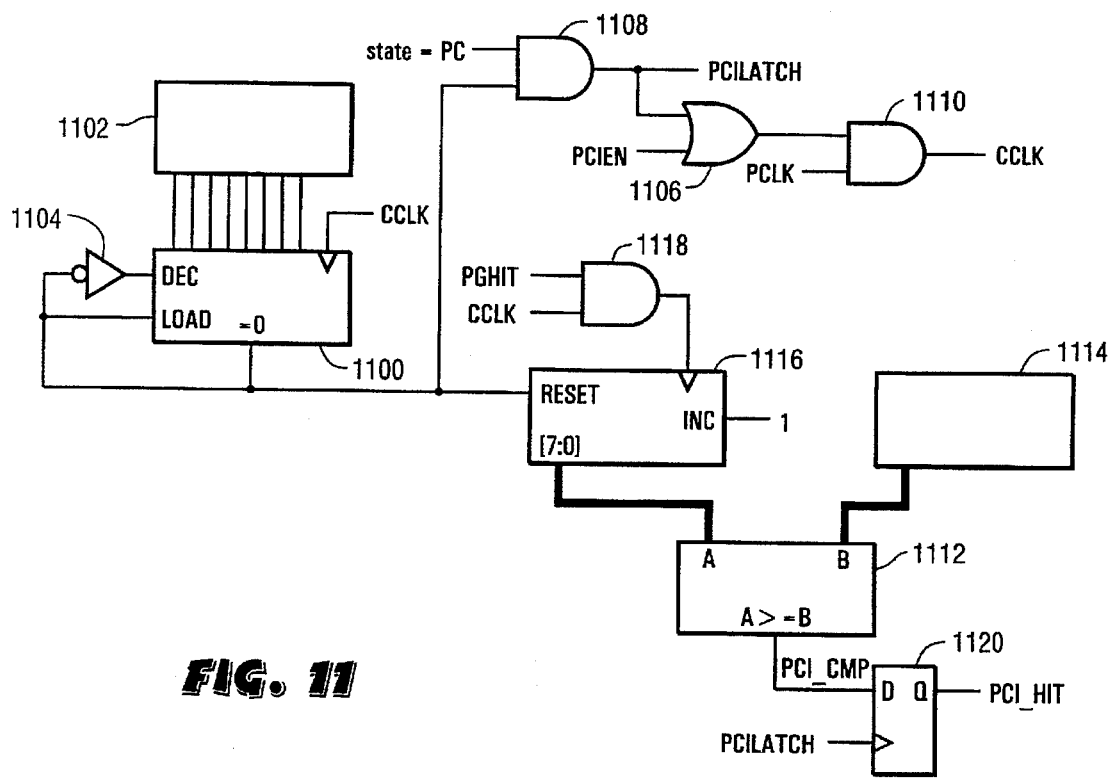

Turning to FIG. 11, this shows the circuitry used to generate the various hit signals associated with each state. Specifically, this circuitry is associated with a code read memory cycle followed by the idle state, or PCI. As is seen at the bottom, this circuitry generates a PCI_HIT signal, which is provided to the dynamic multiplexer 1004. The inputs of a countdown counter 1100 are connected to preload register 1102. This countdown counter 1100 loads the value in the preload register 1102 when the countdown counter 1100 reaches zero. This is done by tying the zero output to the load input. If the countdown counter 1100 has not reached zero, it decrements whenever clocked. This is accomplished by tying the zero output inverted through an inverter 1104 to the decrement line of the countdown counter 1100. In FIG. 11, for clarity, none of the system startup and testing circuitry is shown.

The countdown counter 1100 is clocked by CCLK. This is generated by using an OR gate 1106 to OR the PCIEN signal (the code-followed-by-idle enable signal, which goes high whenever a code cycle followed by enable cycle occurs in response to the state machine of FIG. 12 entering the PCI state) with the PCILATCH signal, which is generated by ANDing, with an AND gate 1108, a signal indicating that the state machine described in FIG. 13 is in the PC, or code read, state, and the output of the countdown counter 1100. The signal out of the OR gate 1106 is then ANDed with PCLK in the AND gate 1110 to form CCLK.

In the preferred embodiment, the value stored in the preload register 1102 is $2^n-1$, where n is a value from 0 to 7; that is 255, 127, 63, 31, 15, 7, 3, or 1. Although a wider range of preload values could be implemented, using a three bit exponent value from 0 to 7 allows two such three bit values and the mode bits MODE(1..0) to all be loaded in a single 8 bit register through a write to an I/O port. In the preferred embodiment, the state combination's counter circuitry for the burst code read memory cycles has its own three bit exponent for the preload value, and the other 3 cycles use the remaining 3 bit value as an exponent. These initial values are set up by other circuitry not shown, and this preload value simply adjusts the number of times this particular cycle combination must occur before the PCI_HIT signal is either set high or low. That is, it is the number of times the cycle combination must be sampled before MPMON will make a prediction on whether or not a page hit will occur next.

The inputs of a comparator 1112 are connected to the outputs of a threshold register 1114 and a hit counter 1116. The threshold register 1114 is a programmable register, in a manner like the preload register. As previously noted, the threshold values are hardwired, but to keep the percentage the same, the threshold value is shifted to the right (i.e. divided by two) for each value used in the preload register 1102 less than 255 (i.e. if preload of 127 used, divide threshold value by two). Although the loading of the threshold counter 1114 and the preload counter 1102 are not shown, this is accomplished typically by the system software of the computer system C during startup or POST.

The hit counter 1116 counts the number of occurrences of this cycle combination, here a code read followed by an idle, on which a page hit indicated by PGHIT also occurs. This is done through an AND gate 1118 which receives the CCLK signal, which then drives the clock of the page hit counter 1116.

When PCILATCH goes high, this indicates that the occurrence counter 1100 has reached zero and the current state is the code read, or PC state. When this happens, the output of the comparator 1112 is then latched out to PCI_HIT through the latch 1120. This value will be high, or true, when the page hit counter 1116 is greater than the threshold register 1114 when the PCILATCH signal goes high.

Thus, in practice, the countdown counter 1100 will count occurrences of code reads allowed by idles until it reaches 0, at which time, the value of the page hit counter 1116 is compared to the threshold counter 1114. If the number of page hits exceeds the threshold, then the PCI_HIT signal is set high, indicating that the next time this sort of cycle occurs, MPMON is predicting a page hit, and the dynamic multiplexer 1004 then maps the PCI_HIT signal to MPMON_EN, and then through the mode multiplexer 1000, if set into the correct mode, and finally out as MPM_HIT, all as shown in FIG. 10. Otherwise, whenever this cycle combination again occurs, MPMON will be predicting a page miss, in which case MPM_HIT will be low and RAS precharge will occur as shown in FIG. 8.

The circuitry of FIG. 11 is repeated for each combination except for a code read followed by a cache hit and a data read followed by a cache hit. As previously discussed, the precharge is always performed on both of these cycles combinations.

Figure 12:
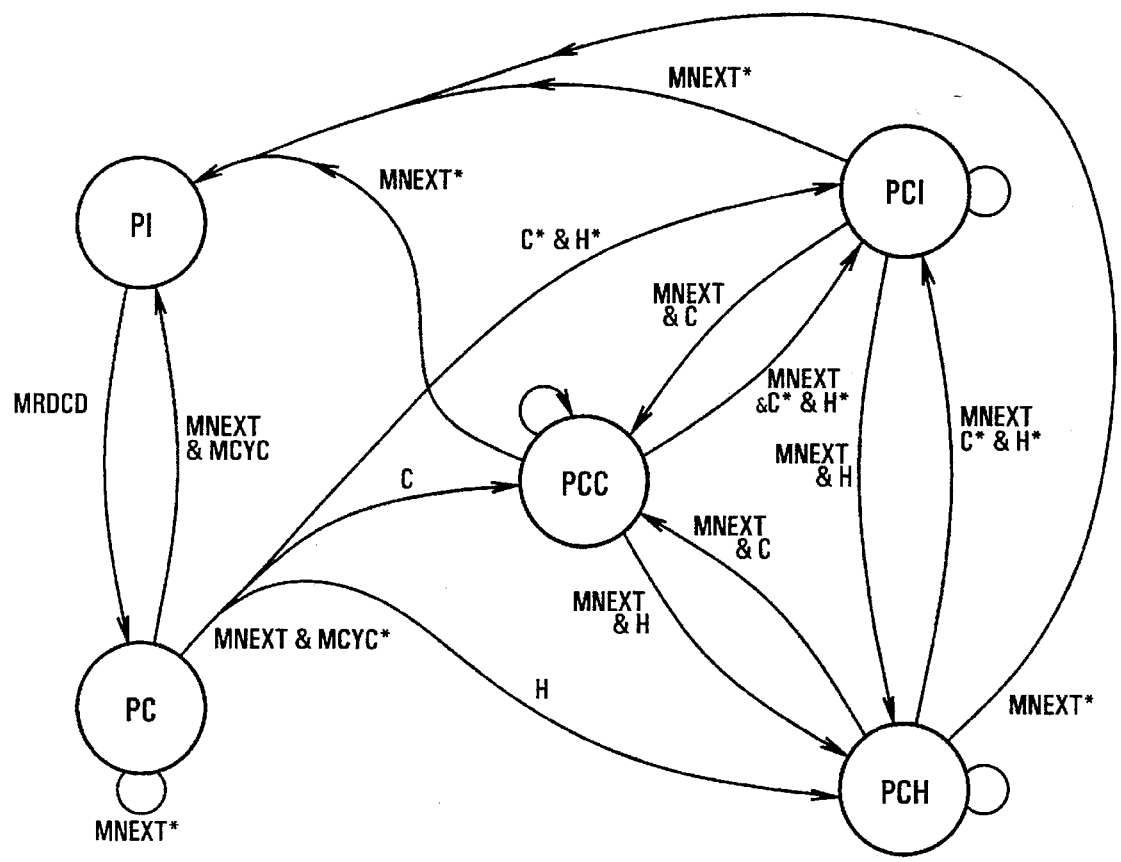
Figure 13:
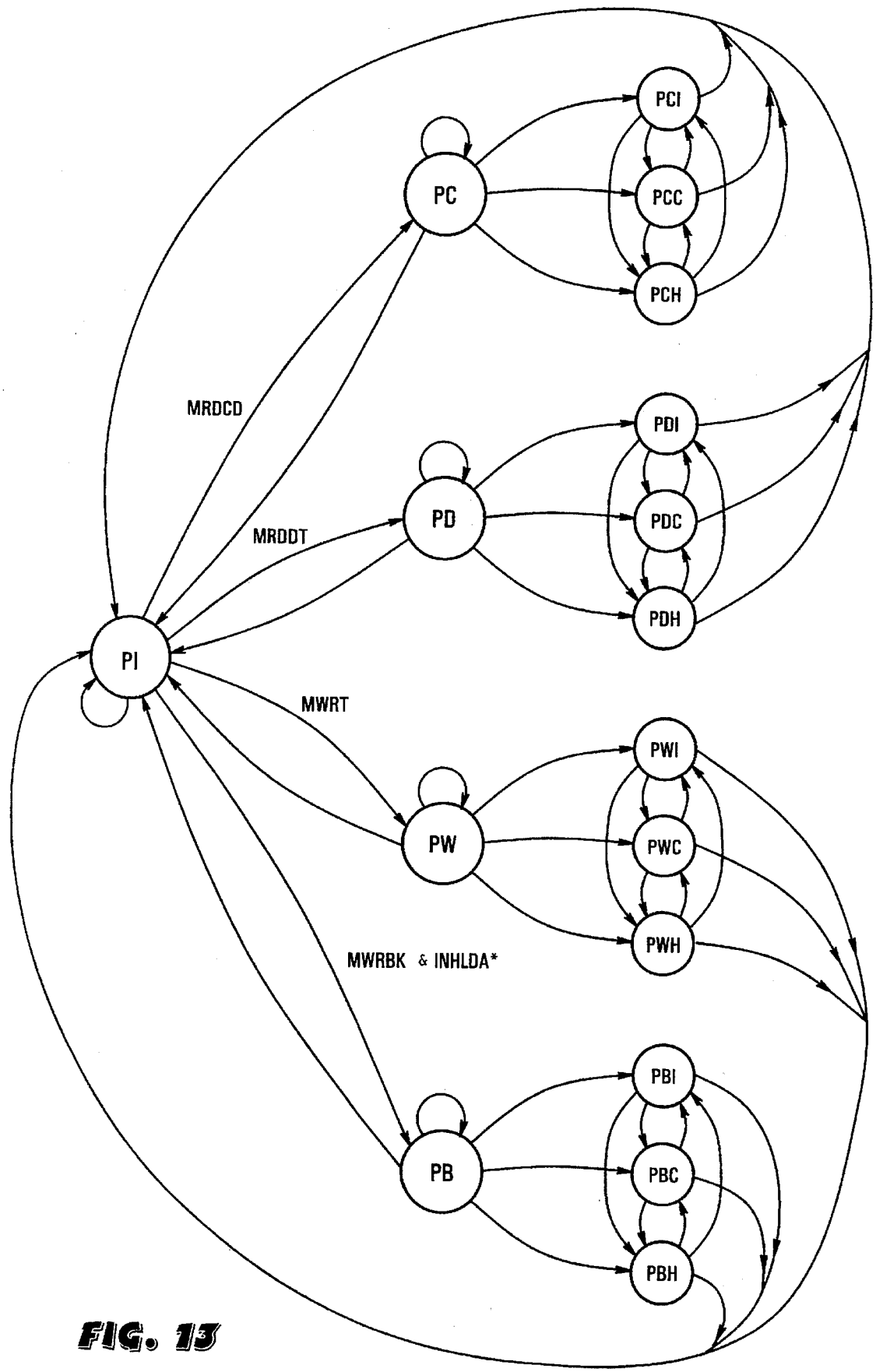

Referring to FIGS. 12 and 13, FIG. 13 shows the state machine used by MPMON to determine what combination of memory cycle followed by other cycle is executed, and FIG. 12 shows in detail that portion of the state machine related to a code read cycle. Turning to FIG. 12, the state machine begins in state PI, or idle state. Note that all transitions in this state machine occur on PCLK. From state PI, the state machine proceeds to state PC, or code read, when the signal MRDCD becomes true. This signal indicates that a memory read code cycle has been executed and is further described in FIG. 14.

From the PC state, the state machine remains in that state while MNEXT remains false. MNEXT is further described in FIG. 14, but basically indicates the next state in the memory state machine MEM in FIG. 8 will be state MN or MI. If MNEXT goes true and a memory cycle is in progress, and thus MCYC is true, the state machine returns to the idle state PI, as there is no need to predict whether a page hit will occur. If MNEXT goes true, indicating that the MN or MI states are to be entered, and MCYC remains false, indicating that a memory cycle is not in progress, the state machine proceeds from state PC to one of three states, PCI, PCC, or PCH. It does this in response to the next cycle being a cache hit cycle, a host bus cycle, or an idle cycle.

A signal referred to as C indicates a cache hit cycle, while a signal referred to as H indicates a host bus cycle. The signals are provided by other logic in the memory controller 156, which logic is omitted from this description for clarity. It is noted that C and H cannot be simultaneously true or asserted. If C and H are false, indicating neither a cache hit nor a host bus cycle, the state machine proceeds to state PCI. If C is true, and thus a cache hit cycle follows, the state machine proceeds to state PCC. Finally, if the next cycle is a host bus cycle, indicated by H, the machine proceeds to PCH. From this point, the state machine proceeds between the three states, PCI, PCC, and PCH, respondably to the C and H signals as long as MNEXT is true. When MNEXT goes false, however, the machine returns to the idle state PI.

Turning to FIG. 13, this shows the state machine of FIG. 12 repeated for each of the four types of memory cycles, PC, PD, PW, and PB. The PD cycle is reached when the MRDDT signal goes true, the PW, or single write state is reached when the MWRT, or single write signal is true, and the PB or write back state is reached when the WRBK signal is true indicating a write back cycle and IHHLDA is false, indicating a write back cycle due to processor operations such as a cache flush, not due to a snoop hit during external bus master operations, which are always page hits.

Figure 14:
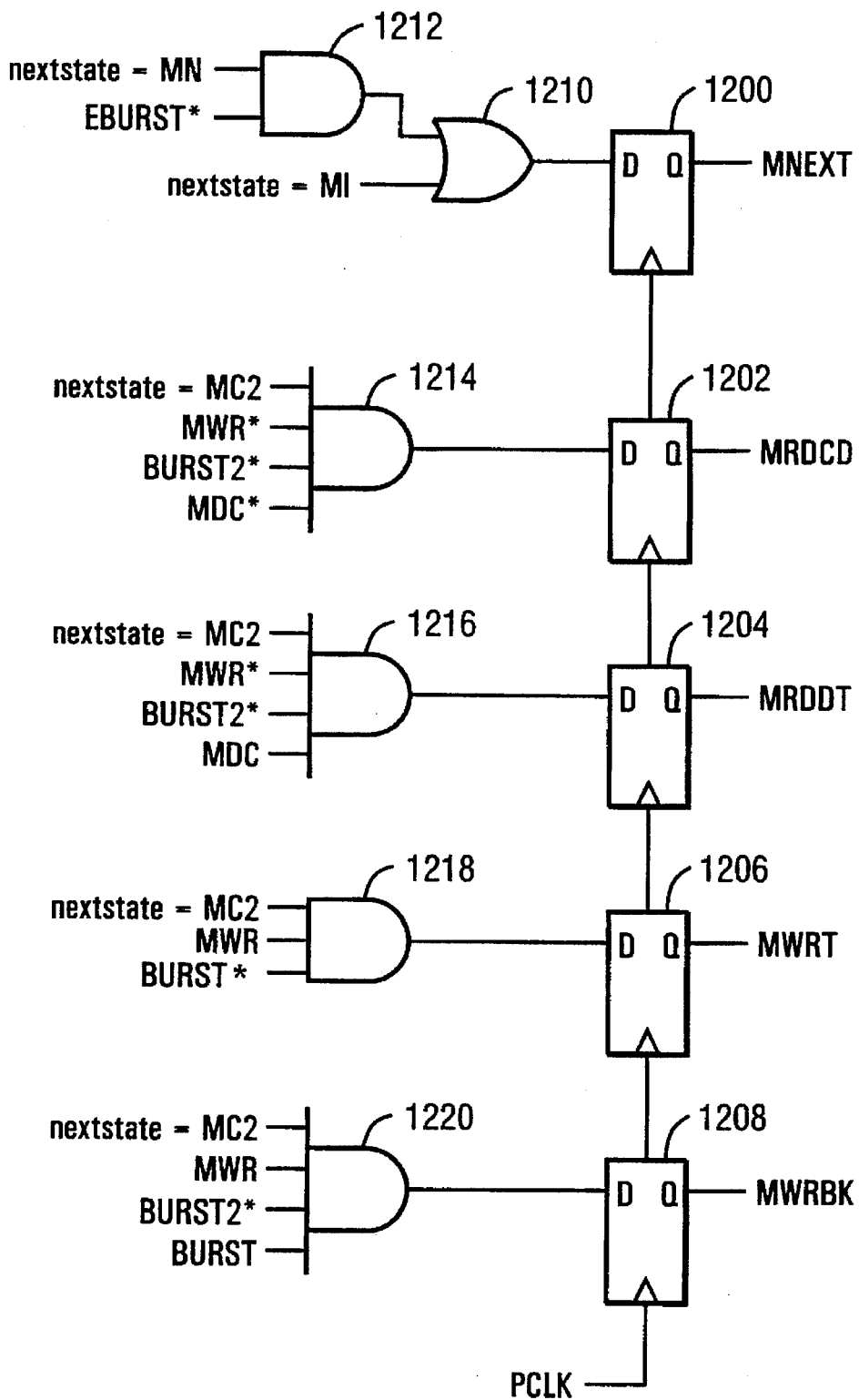

Turning to FIG. 14, this shows the generation of the signals which cause transitions in the state machine shown in FIG. 12 and 13. As seen, the MNEXT, MRDCD, MRDTD, MWRT, and MWRBK signals are generated through flip-flops 1200 through 1208, which are clocked by PCLK. MNEXT is generated by ORing in an OR gate 1210 a signal indicating the next state of the state machine of FIG. 8 will be MI with the EBURST* signal ANDed in an AND gate 1212 with a signal indicating the next of the state machine of FIG. 8 will be MN.

The MRDCD signal is generated by ANDing in an AND gate 1214 a signal indicating the next state of the state machine of FIG. 8 will be MC2 with the MWR*, BRST2*, and MDC* signals. The MRDDT signal is generated by ANDing in an AND gate 1216 the same signals as ANDed in the AND gate of 1214, with the exception that the MDC signal must now be true.

The MWRT signal is generated by ANDing in an AND gate 1218 a signal indicating the next state of the state machine of FIG. 8 will be MC2 with the signals MWR and BRST2*. Finally, the MWRBK signal is generated by anding in an AND gate 1220 a signal indicating the next state of the state machine of FIG. 8 will be MC2 with the MWR, BRST2*, and BRST signals.

Therefore the memory performance monitor can adaptively determine whether to leave the MRAS* signal low or initiate a precharge sequence, and in so doing a performance increase is obtained. Even if the simpler best guess case is used, performance is improved over simply holding MRAS* low. In testing, a particular test set was executed with the L2 cache 154 not present or disabled and using 80 ns memory devices. Using either the best guess case or fully adaptive case, an approximate 5% improvement over the MRAS* low case was obtained. It is noted that is one particular sample, and the results will vary from system to system and program to program.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A memory controller for controlling page mode dynamic random access memory devices in a computer system, the computer system executing cycles, the cycles having cycle types, a portion of which cycles and cycle types are directed to and performed by the dynamic random access memory devices and a remaining portion of which cycles and cycle types are directed to and performed by other devices in the computer system or are idle cycle types, the dynamic random access memory devices including row and column address strobe inputs and requiring precharging, the memory controller comprising:

means for determining presence of a cycle and cycle type directed to and performed by the dynamic random access memory devices as a first cycle;

means for determining when a cycle is performed by the other devices in the computer system or is an idle cycle type as a second cycle; and means coupled to said means for determining presence of said first cycle and said means for determining the performance of said second cycle for providing row and column address strobe signals to said dynamic random access memory devices to control operation of the dynamic random access memory devices, said means for providing row and column address strobe signals selectively keeping said row address strobe signal asserted based on the cycle type of said first cycle when said second cycle immediately follows said first cycle and deasserting said row address strobe signal and precharging said dynamic random access memory devices in remaining cases based on the cycle type of said first cycle when said second cycle immediately follows said first cycle.

2. The memory controller of claim 1, wherein the cycle types include idles, memory code reads, memory data reads, memory single writes and memory burst writes and wherein said means for providing row and column address strobe signals keeps said row address strobe signal asserted for memory code read and memory single write cycle types and deasserts said row address strobe signal and precharges said dynamic random access memory devices for memory data reads and memory burst writes.

3. The memory controller of claim 1, wherein the second cycle is performed by one of a plurality of other devices or is an idle cycle type and wherein said means for providing row and column address strobe signals further includes means for determining which of the plurality of other devices is performing said second cycle or whether said second cycle is an idle cycle type in selectively keeping based on a selection basis said row address strobe signal asserted or deasserting said row address strobe signal and precharging said dynamic random access memory devices.

4. The memory controller of claim 3, wherein said means for providing row and column address strobe signals includes means for dynamically changing the selection basis for keeping said row address strobe signal asserted or deasserting said row address strobe signal and precharging said dynamic random access memory devices.

5. The memory controller of claim 4, wherein said means for dynamically changing the selection basis includes means for determining whether to keep said row address strobe signal asserted or deassert said row address strobe signal and precharge said dynamic random access memory devices for a plurality of the combinations of cycle types of said first cycle and which of the plurality of other devices is performing said second cycle or whether said second cycle is an idle cycle type.

6. The memory controller of claim 5, wherein each of said means for determining whether to keep said row address strobe signal asserted or deassert said row address strobe signal and precharge said dynamic random access memory devices includes:

means for counting a total number of occurrences of the cycle type of said first cycle followed by said second cycle performing device or idle condition, said means providing a total count;

means for counting a number of occurrences of the cycle type of said first cycle followed by said second cycle performing device or idle condition wherein said second cycle was a page hit of said dynamic random access memory devices, said means providing a page hit count;

means for determining when the total count of said means for counting total occurrences has reached a predetermined value;

means for comparing the page hit count to a predetermined value when the total count of said means for counting total occurrences has reached said predetermined value; and means for indicating to keep the row address strobe signal asserted when the page hit count exceeds said predetermined value as determined by said means for comparing.

7. The memory controller of claim 6, wherein said predetermined value of said means for counting total occurrences and said predetermined value for comparing the page hit count are alterable.

8. The memory controller of claim 6, wherein said cycle types of said first cycle include data read burst cycles, code read burst cycles, single write cycles and burst write cycles and wherein the plurality of other devices performing cycles includes a cache controller and an external bus.

9. The memory controller of claim 8, wherein said means for determining whether to keep said row address strobe signal asserted or deassert said row address strobe signal and precharge said dynamic random access memory devices are provided for all but said data read burst cycles followed by cache cycles and code read burst cycles followed by cache cycles and for those cases said row address strobe signal is deasserted and said dynamic random access memory devices are precharged.

10. A method for controlling page mode dynamic random access memory devices in a computer system, the computer system executing cycles, the cycles having cycle types, a portion of which cycles and cycle types are directed to and performed by the dynamic random access memory devices and a remaining portion of which cycles performed by other devices in the computer system or being idle cycle types, the dynamic random access memory devices including row and column address strobe inputs and requiring precharging, the method comprising the steps of:

determining presence of a cycle and cycle type directed to and performed by the dynamic random access memory devices as a first cycle;

determining when a cycle is performed by the other devices in the computer system or is an idle cycle type as a second cycle; and providing row and column address strobe signals to said dynamic random access memory devices to control operation of the dynamic random access memory devices by selectively keeping said row address strobe signal asserted based on the cycle type of said first cycle when said second cycle immediately follows said first cycle and deasserting said row address strobe signal and precharging said dynamic random access memory devices in remaining cases based on the cycle type of said first cycle when said second cycle immediately follows said first cycle.

11. The method of claim 10, wherein the cycle types include idles, memory code reads, memory data reads, memory single writes and memory burst writes and wherein said step of providing row and column address strobe signals keeps said row address strobe signal asserted for memory code read and memory single write cycle types and deasserts said row address strobe signal and precharges said dynamic random access memory devices for memory data reads and memory burst writes.

12. The method of claim 10, wherein the second cycle is performed by one of a plurality of other devices or is an idle cycle type and wherein said step of providing row and column address strobe signals further determines which of the plurality of other devices is performing said second cycle or whether said second cycle is an idle cycle type in selectively keeping based on a selection basis said row address strobe signal asserted or deasserting said row address strobe signal and precharging said dynamic random access memory devices.

13. The method of claim 12, wherein said step of providing row and column address strobe signals includes the step of dynamically changing the selection basis for keeping said row address strobe signal asserted or deasserting said row address strobe signal and precharging said dynamic random access memory devices.

14. The method of claim 13, wherein said step of dynamically changing the selection basis includes the step of determining whether to keep said row address strobe signal asserted or deassert said row address strobe signal and precharge said dynamic random access memory devices for a plurality of combinations of cycle types of said first cycle and which of the plurality of other devices is performing said second cycle or whether said second cycle is an idle cycle type.

15. The method of claim 14, wherein said step of determining whether to keep said row address strobe signal asserted or deassert said row address strobe signal and precharge said dynamic random access memory devices for each case includes the steps of:

counting a total number of occurrences of the cycle type of said first cycle followed by said second cycle performing device or idle condition, said counting providing a total count;

counting a number of occurrences of the cycle type of said first cycle followed by said second cycle performing device or idle condition wherein said second cycle was a page hit of said dynamic random access memory devices, said counting providing a page hit count;

determining when the total count of said means for counting total occurrences has reached a predetermined value;

comparing the page hit count to a predetermined value when the total count of said means for counting total occurrences has reached said predetermined value; and indicating to keep the row address strobe signal asserted when the page hit count exceeds said predetermined value as determined by said comparing step.

16. The method of claim 15, wherein said predetermined value of said step of counting total occurrences and said predetermined value for said step of comparing the page hit count are alterable.

17. The method of claim 15, wherein said cycle types of said first cycle include data read burst cycles, code read burst cycles, single write cycles and burst write cycles and wherein the plurality of other devices performing cycles includes a cache controller and an external bus.

18. The method of claim 17, wherein said step of determining to keep asserted or to deassert is performed for all but said data read burst cycles followed by cache cycles and code read burst cycles followed by cache cycles and for those cases said row address strobe signal is deasserted and said dynamic random access memory devices are precharged.

* * * * *

UNITED STATES PATENT AND TRADEMARK OFFICE
CERTIFICATE OF CORRECTION

PATENT NO. : 5,651,130

DATED : JULY 22, 1997

INVENTOR(S) : HINKLE, ET AL.

It is certified that error appears in the above-identified patent and that said Letters Patent is hereby corrected as shown below:

In column 5, line 49, please delete "the".

Signed and Sealed this

Seventh Day of October, 1997

Attest:

BRUCE LEHMAN

Attesting Officer

Commissioner of Patents and Trademarks